United States Patent [19]

Nakajima

[11] Patent Number: 5,798,571
[45] Date of Patent: Aug. 25, 1998

[54] INDUCTANCE REDUCED WIRE-BONDING TYPE SEMICONDUCTOR DEVICE

[75] Inventor: Hirofumi Nakajima, Tokyo, Japan

[73] Assignee: NEC Corporation, Tokyo, Japan

[21] Appl. No.: 674,721

[22] Filed: Jul. 2, 1996

[30] Foreign Application Priority Data

Jul. 4, 1995 [JP] Japan ................. 7-168562

[51] Int. Cl.⁶ .......................... H01L 23/48; H01L 23/52; H01L 29/40
[52] U.S. Cl. .............. 257/784; 257/748; 257/691; 257/786; 257/773
[58] Field of Search ....................... 257/748, 691, 257/666, 698, 676, 678, 692, 697, 690, 773, 786, 784, 782, 776

[56] References Cited

U.S. PATENT DOCUMENTS

| | | | |
|---|---|---|---|
| 4,608,592 | 8/1986 | Miyamoto | 257/691 |
| 5,309,024 | 5/1994 | Hirano | 257/697 |
| 5,386,141 | 1/1995 | Liang et al. | 257/691 |
| 5,497,030 | 3/1996 | Takeuchi | 257/676 |
| 5,530,287 | 6/1996 | Currie et al. | 257/697 |

FOREIGN PATENT DOCUMENTS

| | | | |
|---|---|---|---|
| 62-5649 | 1/1987 | Japan | 257/691 |
| 3-244149 | 10/1991 | Japan . | |

*Primary Examiner*—Mahshid D. Saadat
*Assistant Examiner*—Jhihan B. Clark
*Attorney, Agent, or Firm*—Sughrue, Mion, Zinn, Macpeak & Seas, PLLC

[57] ABSTRACT

The invention provides a wire-bonding type semiconductor device including, a semiconductor chip, a plurality sets of electrode pads formed on the semiconductor chip, each set including a power supply electrode, at least one signal electrode pad and a gland electrode pad arranged in this order, a mount on which the semiconductor chip is placed, the mount being formed with the same number of extensions as the number of the gland electrode pads, the extension acting as gland leads, the same number of power supply leads as the number of the power supply electrode pads, the same number of signal leads as the number of the signal electrode pads, the power supply leads, the signal leads and the projections acting as gland leads being arranged in this order, and metal wires for connecting each of the power supply electrode pads, signal electrode pads and gland electrode pads to the power supply leads, the signal leads and the extensions, respectively, the metal wires being disposed substantially in parallel with one another and having substantially the same length. The invention makes it possible to remarkably reduce effective inductance of thin metal wires, and thus provides a high-speed operable semiconductor device which can be fabricated by conventional wire-bonding techniques and has significantly low gland bounce noise and cross-talk which would be caused by concurrent switching.

15 Claims, 4 Drawing Sheets

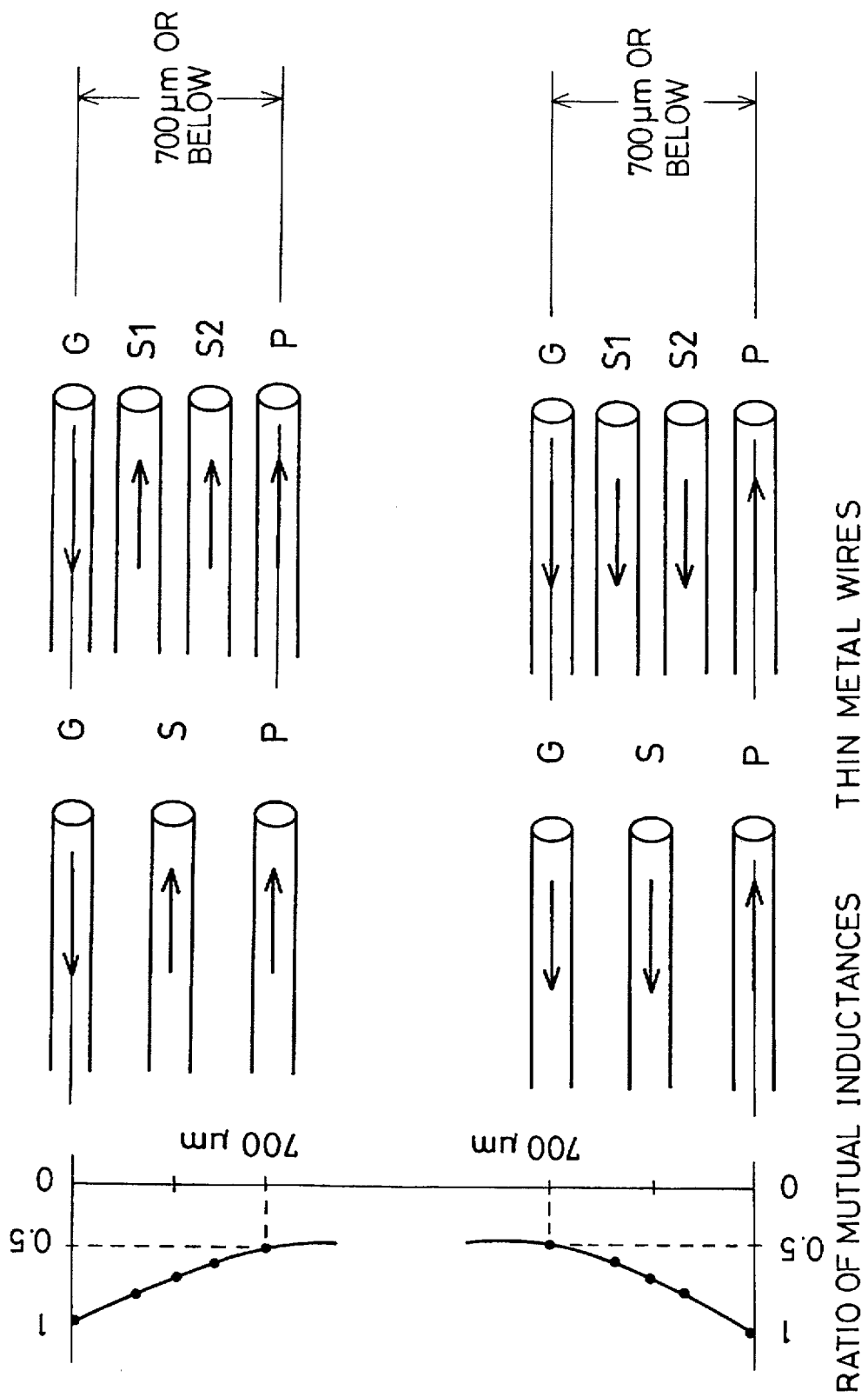

5,798,571

1

INDUCTANCE REDUCED WIRE-BONDING TYPE SEMICONDUCTOR DEVICE

BACKGROUND OF THE INVENTION

1. Field of the Invention

The invention relates to a wire-bonding type semiconductor device in which electrode pads or bonding pads formed on a semiconductor chip are connected to internal terminals of a package through metal thin wires, and more particularly to such a wire-bonding type semiconductor device having a structure for reducing inductance which is caused by metal thin wires.

2. Description of the Related Art

With demands of high-speed operation and operation in a reduced voltage in electronic devices, a semiconductor device has been required to have higher and higher electrical characteristics, and hence it is now very important to avoid noises which would cause malfunction or unintended operation. In particular, a high-speed operable gate array or micro-processor is forced to have a smaller lead pitch than before as the number of pins to be used therein is increased. Thus, when high frequency is transmitted through a certain lead, the high frequency imparts noises to an adjacent lead. This is so-called "cross-talk noise". In addition, the smaller lead pitch brings a problem of ground bounce noise, that is, a voltage is fluctuated by a counter electromotive force generated by a current which would be produced when a plurality of transistors are concurrently switched in a semiconductor chip.

In order to overcome the above mentioned problems, Japanese Unexamined Patent Publication No. 3-244149 has proposed a semiconductor device having a plastic package. As illustrated in FIG. 1, the semiconductor device includes a semiconductor chip 30, a pad (not numbered) on which the semiconductor chip is mounted, a ground pad 31 disposed around the pad, a plurality of power supply pads 32 disposed around the ground pad 31. There are formed a plurality of signal leads 33 around each of the power supply pads 32 which is connected to an external power supply lead 34. The ground pad 31 is electrically connected to external ground leads 35. Each of ground electrode pads 36 formed on the semiconductor chip 30 is electrically connected to the ground pad 31 through a first thin metal wire 37. Each of power supply electrode pads 38 formed on the semiconductor chip 30 is electrically connected to each of the power supply pads 32 through a second thin metal wire 39. Each of signal electrode pads 40 formed on the semiconductor chip 30 is electrically connected to each of the signal leads 33 through a third thin metal wire 41. The ground pad 31 is also electrically connected to an associated signal lead through a fourth thin metal wire 42.

The illustrated semiconductor device attempts to reduce inductance in a lead frame by disposing the groping pads 31 and power supply pads 32 around the pad on which the semiconductor chip 30 is mounted.

In a ball grid array using a ceramic package or a glass epoxy substrate, attempts have been made to reduce(ground bounce noise by encasing power supply layers and/or ground layers in a package.

However, the above mentioned semiconductor devices have shortcomings as follows.

Inductances are generated from thin metal wires as well as a package and a lead frame. A first problem of the prior semiconductor devices is that they can reduce inductances of a package and a lead frame, but cannot reduce inductances

2 of power supply and ground metal wires. A thin metal wire has a self-inductance of about 0.9 nH per millimeter, and accordingly a thin metal wire having a length of 4 mm has an inductance of about 3.6 nH, which may be greater than an inductance of an entire package. Thus, it is absolutely necessary to reduce inductances of the thin metal wires.

A second problem of the prior semiconductor devices is as follows. In Japanese Unexamined Patent Publication No. 3-244149, it is asserted that the formation of the ground pads 31 and power supply pads 32 provides a micro-strip structure, and hence it is possible to reduce inductance in the thin metal wires 36 to 42. However, the reduction of inductance as asserted in the Publication is theoretically impossible to be accomplished. The reason is as follows. A characteristic impedance of a semiconductor device is given by the following equation:

$$Z_0 = 60/[\epsilon^{1/2} \times \ln(5.98b/1.8\omega)] \quad (A)$$

wherein $Z_0$ represents a characteristic impedance, $\epsilon$ represents a dielectric constant, $\omega$ represents a diameter of a thin metal wire, and b represents a spacing between the ground pad 31 and the thin metal wire. In order to reduce an inductance to be caused by thin metal wires by means of a micro-strip structure, it is necessary to arrange the spacing between the ground pad and thin metal wire, represented with "b", to be about 48 μm in accordance with the equation (A).

However, it is very difficult or almost impossible to move wedge tools and/or capillaries during wire-bonding so that the narrow spacing as mentioned above is kept unchanged and the thin metal wires 36 to 42 are kept in parallel with the ground pad 31. Even if possible, there is high risk that the thin metal wires are moved and thus short-circuited with one another in a subsequent, transfer-molding step.

SUMMARY OF THE INVENTION

In view of the above mentioned problems of the prior semiconductor devices, it is an object of the present invention to provide a wire-bonding type semiconductor device having no inductances caused by thin metal wires.

The present invention provides a wire-bonding type semiconductor device including; a semiconductor chip; a plurality of power supply electrode pads formed on the semiconductor chip; a plurality of signal electrode pads formed on the semiconductor chip; a plurality of ground electrode pads formed on the semiconductor chip; a plurality of first thin metal wires for electrically connecting the power supply electrode pads to associated internal terminals of a package; a plurality of second thin metal wires for electrically connecting the signal electrode pads to associated internal terminals of a package; and a plurality of third thin metal wires for electrically connecting the ground electrode pads to associated internal terminals of a package. The power supply electrode pads, the signal electrode pads and the ground electrode pads are arranged on the semiconductor chip so that at least one signal electrode pad is always disposed intermediate between a power supply electrode pad and a ground electrode pad. The first, second and third thin metal wires are designed so that a first thin metal wire, a third thin metal wire and at least one second thin metal wire located intermediate between the first and third thin metal wires are disposed substantially in parallel with one another and have substantially the same length.

In the above mentioned wire-bonding type semiconductor device, it is preferable that wires leading to the power supply electrode pads and the ground electrode pads are converged in a route from the internal terminals of a package to external terminals so that the number of power supply external terminals and ground external terminals is smaller than the number of the power supply electrode pads and ground electrode pads.

The first thin metal wire, the third thin metal wire and the at least one second thin metal wire located intermediate between the first and third thin metal wires are preferably disposed within a width of 700 μm.

The wire-bonding type semiconductor device may have a plastic ball grid array structure. It is preferable that the semiconductor chip is mounted on a package constituted of a multi-layered substrate. The at least one second thin metal wire located intermediate between the first and third thin metal wires is preferably used for emitting a signal therefrom.

The present invention further provides a wire-bonding type semiconductor device including: a semiconductor chip; a plurality of sets of electrode pads formed on the semiconductor chip, each set including a power supply electrode, at least one signal electrode pad and a ground electrode pad arranged in this order; a mount on which the semiconductor chip is placed; the mount being formed with the same number of extensions as the number of the ground electrode pads, the extension acting as ground leads; the same number of power supply leads as the number of the ground electrode pads; the same number of signal leads as the number of the ground electrode pads; the power supply leads, the signal leads and the projections acting as ground leads being arranged in this order; and metal wires for connecting each of the power supply electrode pads, signal electrode pads and ground electrode pads to the power supply leads, the signal leads and the extensions, respectively, the metal wires being disposed substantially in parallel with one another and having substantially the same length.

It is preferable that the extensions are short-circuited with one another in the mount so that ground external terminals are smaller in number than the ground electrode pads. It is also preferable that the power supply leads are electrically connected to one another at a lower surface of a package through through-holes formed throughout the package.

The invention still further provides a wire-bonding type semiconductor device including: a multi-layered substrate; a semiconductor chip mounted on the multi-layered substrate; a plurality of power supply electrode pads formed on the semiconductor chip; a plurality of signal electrode pads formed on the semiconductor chip; a plurality of ground electrode pads formed on the semiconductor chip; the power supply electrode pads, the signal electrode pads and the ground electrode pads are arranged on the semiconductor chip so that at least one signal electrode pad is always disposed intermediate between a power supply electrode pad and a ground electrode pad, a plurality of power supply leads formed on a first layer of the multi-layered substrate; a plurality of signal leads formed on a first layer of the multi-layered substrate; a plurality of ground leads formed on a first layer of the multi-layered substrate; a plurality of first thin metal wires for electrically connecting the power supply electrode pads to the power supply leads; a plurality of second thin metal wires for electrically connecting the signal electrode pads to the signal leads; a plurality of third thin metal wires for electrically connecting the ground electrode pads to the ground leads; the first, second and third thin metal wires are designed so that a first thin metal wire, a third thin metal wire and at least one second thin metal wire located intermediate between the first and third thin metal wires are disposed substantially in parallel with one another and have substantially the same length, the same number of signal planes as the number of the signal electrode pads, the signal planes being formed on the first layer of the multi-layered substrate, the signal leads being connected to external terminals through the signal planes; a plurality of power supply planes formed on a second layer of the multi-layered substrate, the power supply leads being connected to the power supply planes through through-holes formed throughout the multi-layered substrate, and converged with one another so that the power supply leads are connected to external terminals which are smaller in number than the power supply electrode pads; and a plurality of ground planes formed on a third layer of the multi-layered substrate, the ground leads being connected to the ground planes through metal plating formed on a sidewall of the multi-layered substrate, and converged with one another so that the ground leads are connected to external terminals which are smaller in number than the ground electrode pads.

For instance, the first layer of the multi-layered substrate is arranged to be disposed on or above the second layer, and the second layer is arranged to be disposed on or above the third layer.

In the wire-bonding type semiconductor device made in accordance with the present invention, a plurality of power supply electrode pads and ground electrode pads are formed on a semiconductor chip. These electrode pads are arranged so that a signal electrode pad is disposed intermediate between a power supply electrode pad and a ground electrode pad. Each of the electrode pads is wire-bonded to an associated internal lead of a package through a thin metal wire. Three thin metal wires deriving from power supply, signal and ground electrode pads are designed to be disposed in substantially parallel with one another and have substantially the same length. Thus, electrical current runs through those three thin metal wires in opposite directions, thereby magnetic fields caused by the three thin metal wires being canceled each other. As a result, self-inductances of the thin metal wires are weakened by mutual inductance.

The magnitude of a self-inductance of a thin metal wire is in dependence on a spacing to an adjacent wire through which a current is running in an opposite direction. If a power supply wire, a ground wire and a signal wire are disposed in a width of 700 μm, an effective inductance of the wires is reduced to about a half of self-inductances of the wires.

With respect to wires for power supply and ground, it is not always necessary to prepare the same number of external leads of a semiconductor package as the number of metal wires. In the present invention, wires extending from internal leads to external leads are converged on the way so that the number of power supply external terminals and ground external terminals may be smaller than the number of the power supply electrode pads and ground electrode pads. Thus, the semiconductor device made in accordance with the present invention can be connected to existing external terminals without any modification thereof.

If there has to be formed many signal electrode pads and it is impossible to dispose a power supply and ground electrode pads in the same number as signal electrode pads, two or three signal electrode pads may be disposed intermediate between a power supply electrode pad and a ground electrode pad. In such a case, it is preferable to dispose thin metal wires extending from a power supply electrode pad, two or three signal electrode pads and a ground electrode pad within a width of 700 μm.

If there has to be formed too many signal electrode pads, and it is impossible to dispose a sufficient number of power supply and ground electrode pads, only a signal electrode pad connected to an output buffer of a semiconductor chip may be disposed intermediate between a power supply electrode and a ground electrode. Such a structure would bring advantageous effects. This is because a current for output signals is much greater than a current for input signals in a semiconductor device.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 3 shows a relationship between a spacing between adjacent thin metal wires and a ratio of mutual inductances;

DESCRIPTION OF THE PREFERRED EMBODIMENTS

Preferred embodiments in accordance with the present invention will be explained hereinbelow with reference to drawings.

Figure 2A:
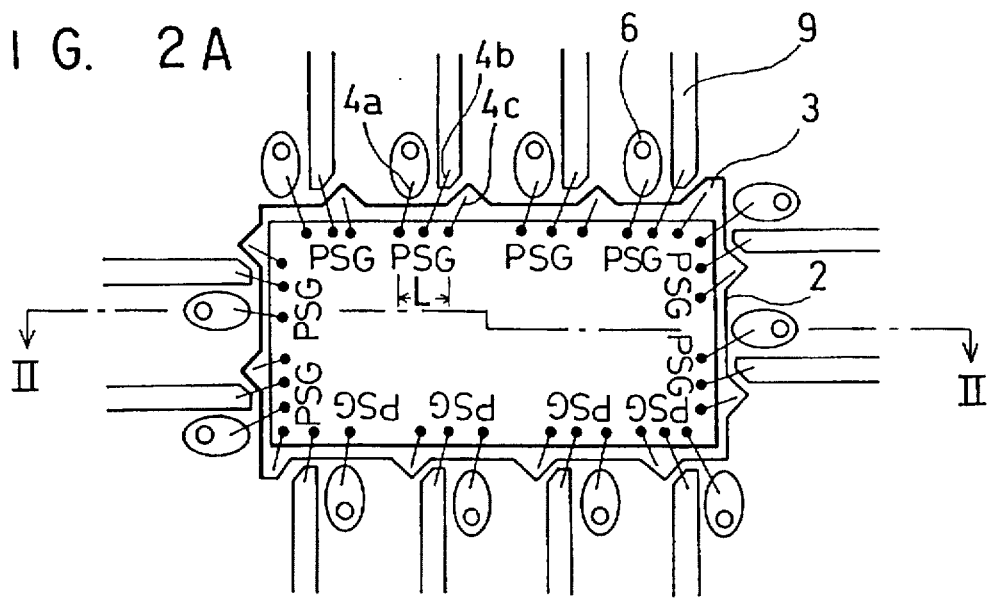
FIG. 2A is a plan view illustrating a wire-bonding type semiconductor device made in accordance with the first embodiment.

Hereinbelow will be explained the first embodiment having a structure of plastic ball grid array, with reference to FIGS. 2A to 2C. A semiconductor chip 1 is mounted on a device mount 2. A plurality of sets of electrode pads are formed on the semiconductor chip 1. Each set includes a power supply electrode P, a signal electrode pad S and a ground electrode pad G arranged in this order, as illustrated in FIG. 2A. That is, the power supply electrode pads P and ground electrode pads G are formed in the same number as the signal electrode pads S, and the signal electrode pad S is disposed intermediate between the power supply electrode pad P and the ground electrode pad G.

The device mount 2 on which the semiconductor chip 1 is placed is formed with the same number of extensions 3 as the number of the ground electrode pads G. In this embodiment, there are formed twelve extensions 3. The extensions 3 are shaped in triangular form, however, may be shaped in other forms such as a semi-circle or polygon. The extensions 3 act as ground leads. There are also formed power supply leads 6 and the signal leads 9 in the same number as the extension or ground leads 3. The power supply leads 6, the signal leads 9 and the extensions or ground leads 3 are arranged in this order, similarly to the set of power supply electrode pads P, the signal electrode pads S and the ground electrode pads G. That is, the signal lead 9 is always disposed intermediate between the power supply lead P and the ground lead G. The power supply lead 6, signal lead 9 and the ground lead 3 are electrically insulated from one another.

These power supply leads 6, signal leads 9 and ground leads 3 are designed to be associated with and electrically bonded to the power supply electrode pads P, signal electrode pads S and ground electrode pads G through first, second and third thin metal wires 4a, 4b and 4c, respectively.

Since the power supply electrode pads P, signal electrode pads S and ground electrode pads G are disposed facing the power supply lead 6, signal lead 9 and ground lead 3, the thin metal wires 4a, 4b and 4c can be arranged to be disposed substantially in parallel with one another and have substantially the same length. In addition, those thin metal wires 4a, 4b and 4c are disposed within a length L of 700 μm or smaller.

As mentioned earlier, there are formed the twelve ground leads 3. Since these twelve ground leads 3 are commonly formed in the device mount 2, the ground leads 3 are short-circuited with one another. Thus, it is possible to form ground plating balls 5, through which the device mount 2 is electrically connected to external terminals, in smaller number than the ground electrode pads G. In the embodiment, there are formed six ground plating balls 5, which is smaller than the number (twelve) of the ground electrode pads G.

Figure 2B:
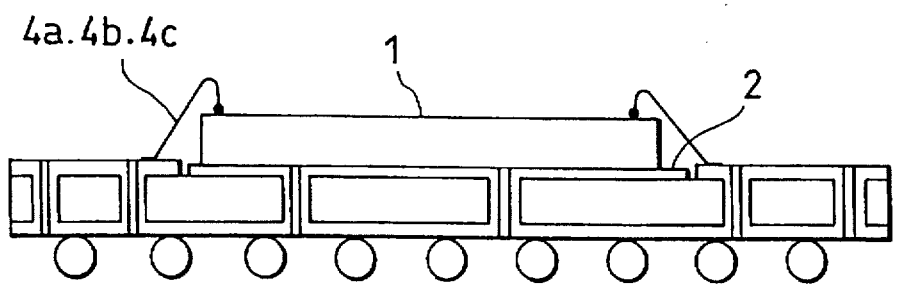
FIG. 2B is a cross-sectional view taken along the line II—II in FIG. 2A.

As illustrated in FIG. 2B, the power supply leads 6 associated with the power supply electrode pads P are electrically connected to one another at a lower surface of the chip 1 through through-holes 7 formed throughout the chip 1. Thus, power supply plating balls 8, through which the power supply electrode pads P are electrically connected to external terminals, may be formed in smaller number than the power supply electrode pads P. In the embodiment, there are formed the twelve power supply pads P on the semiconductor chip 1 as illustrated in FIG. 2A, whereas the ten power supply plating balls 8 are formed on a lower surface of the chip 1.

The signal electrode pads S which are wire-bonded to the signal leads 9 by means of the thin metal wires 4b are led to signal plating balls 10 through through-holes (not numbered). Namely, there are formed the signal plating balls 10 in the same number as the signal electrode pads S.

In accordance with the above mentioned wire-bonding type semiconductor chip, it is possible to wire-bond power supply, signal and ground electrode pads to power supply, signal and ground leads without increasing the number of external leads. As illustrated in FIG. 3, when the thin metal wires bridging between power supply, ground and signal leads and electrode pads are disposed close to one another, the self-inductances are canceled by the mutual inductance, resulting in that the effective inductance is reduced. Though a current may run in opposite directions through the metal wires bridging between the signal electrode pad S and the signal lead 9 (hereinafter, referred to as a signal metal wire). Power supply and ground metal wires are to be used in the same fashion. The effective inductance of a set of power supply, ground and signal metal wires approaches zero (0) in a narrower spacing between adjacent metal wires, as determined in view of a coefficient of coupling. Lines of magnetic force are not closed due to spatial attenuation and various obstacles. Hence, as a spacing between adjacent metal wires becomes greater, the mutual inductance becomes smaller. If the spacing is equal to 700 μm, the mutual inductance is reduced by 50%.

Figure 2C:
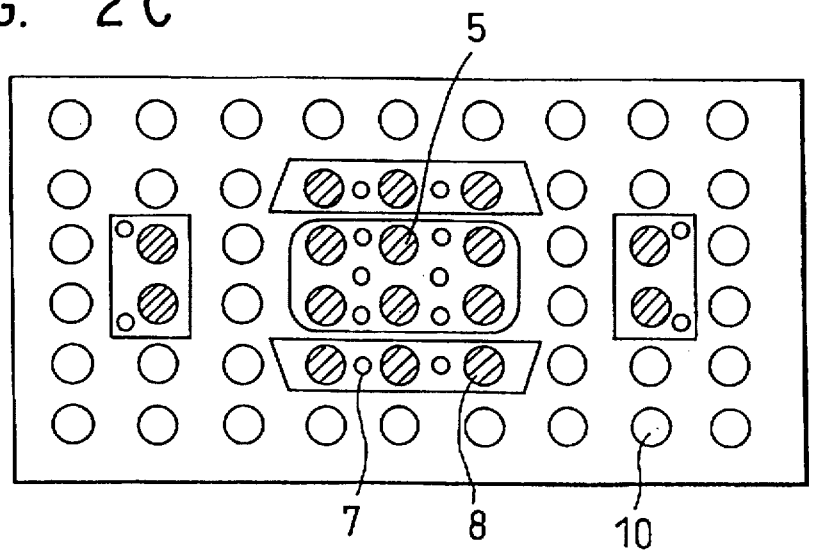
FIG. 2C is a bottom view of the semiconductor device illustrated in FIG. 2A.

In the embodiment illustrated in FIGS. 2A to 2C, the electrode pads P, S and G are spaced with a pitch of 140 μm. If the thin metal wires 4a to 4c are designed to have a length of 3 mm, it would be possible to reduce the effective inductance down to 0.8 nH which is equal to about 30% of the self-inductance.

Figure 1:
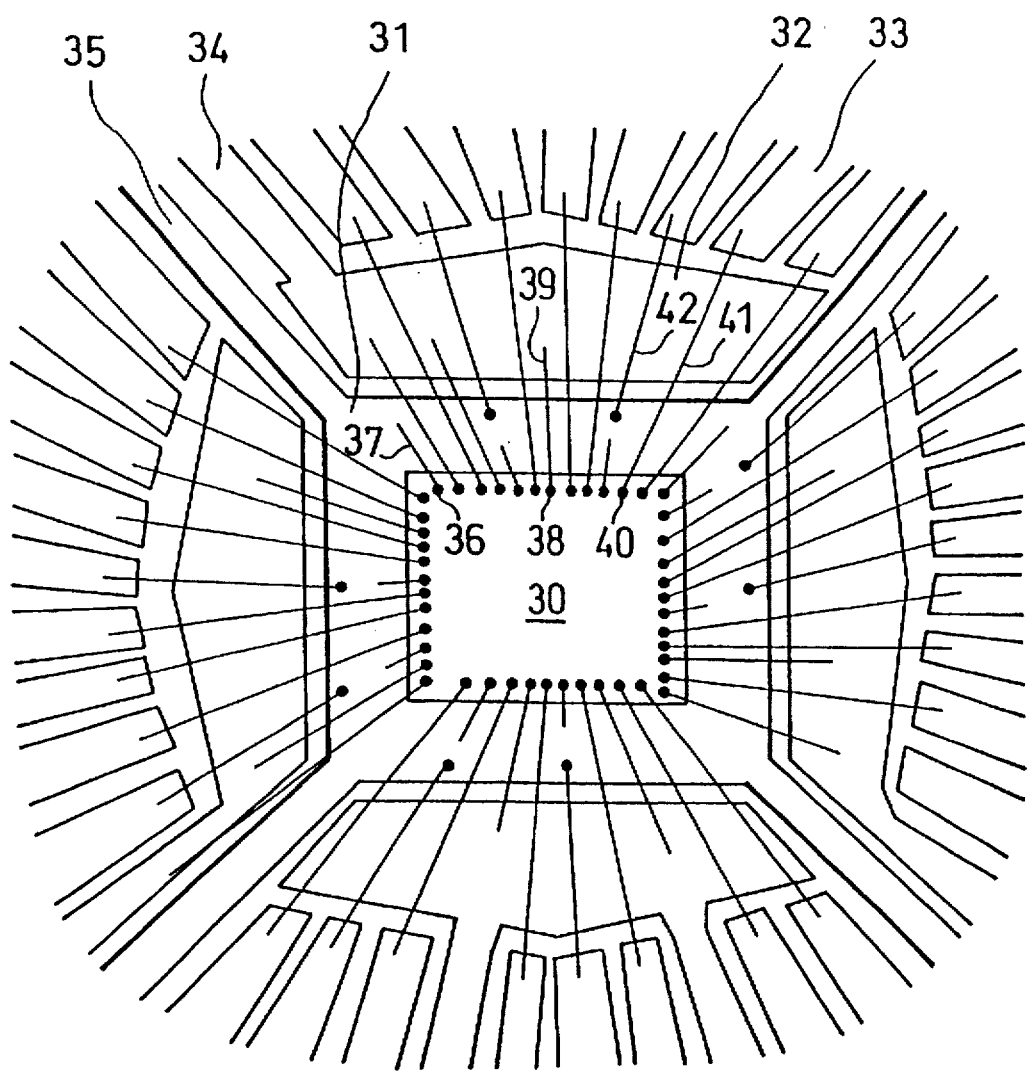
FIG. 1 is a plan view illustrating a conventional wire-bonding type semiconductor device.

In the conventional wire-bonding type semiconductor device illustrated in FIG. 1, since the ground pad 31 constitutes a mount on which a semiconductor chip is to be mounted, it is possible to cause the thin metal wire 37, through which the ground pad 31 is electrically connected to the ground electrode pad 36, to have a length of about 1.5 mm which is within a limit of wire-bonder performance. However, the power supply pad 32 is disposed around the ground pad 31, and the thin metal wire 39, through which the power supply pad 32 is electrically connected to the power supply pad 38, has to have a length of 3.5 mm. The signal pad 33 is disposed around the power supply pad 32, and hence the thin metal wire 41, through which the signal pad 40 is electrically connected to the signal lead 33, has to have a greater length of 5.5 mm. The thin metal wires 37, 39, 41 do not have a common length, have a wide spacing between adjacent metal wires, and are not in parallel with one another. Thus, it is impossible to reduce the self-inductances by virtue of the mutual inductance. Hence, the effective inductances of the ground metal wire, power supply metal wire and signal metal wire reach 1.35 nH, 3.2 nH and 5 nH, respectively.

Figure 4A:
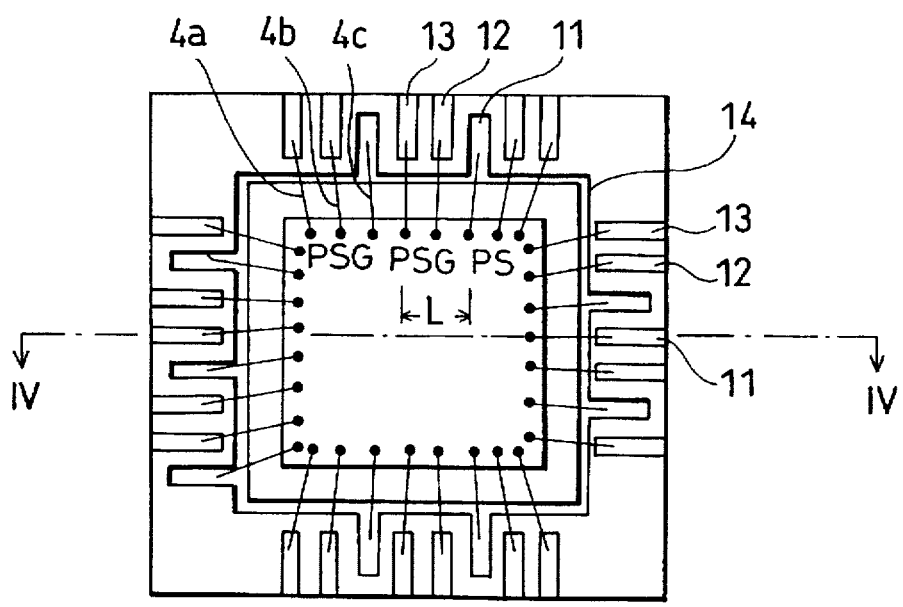
FIG. 4A is a plan view illustrating a wire-bonding type semiconductor device made in accordance with the second embodiment.
Figure 4B:
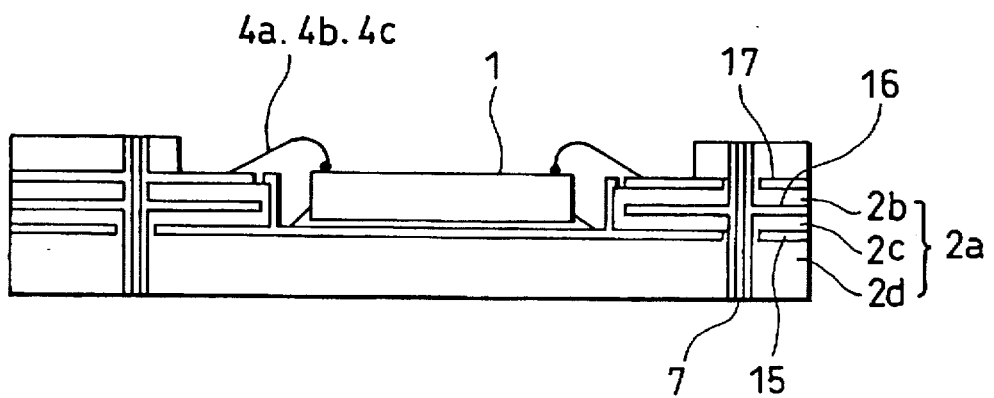
FIG. 4B is a cross-sectional view taken along the line IV—IV in FIG. 4A.

Hereinbelow will be described, with reference to FIGS. 4A and 4B, a wire-bonding type semiconductor device made in accordance with the second embodiment. As illustrated in FIG. 4B, a semiconductor chip 1 is mounted on a package constituted of a multi-layered substrate 2a. The package may be made of ceramic or glass epoxy resin. The package may be formed to have a structure of pin grid array, land grid array, quad flat package, ball grid array or chip carrier.

There are formed a plurality of sets of electrode pads on the semiconductor chip 1. Each set includes a power supply electrode pad (P), a signal electrode pad (S) and a ground electrode pad (G) disposed in this order. That is, the signal electrode pad (S) is always disposed intermediate between the power supply electrode pad (S) and the ground electrode pad (G).

There are also formed sets of lines in the same number as the sets of electrode pads on a top layer 2b of the multi-layered substrate 2a. Each set of lines include a power supply line 13, a signal line 12 and a ground line 11 which are disposed in this order. Namely, similarly to the electrode pads P, S and G, the signal line 12 is always disposed intermediate between the power supply line 13 and the ground line 11.

The power supply electrode pads (P), signal electrode pads (S) and ground electrode pads (G) are wire-bonded to the power supply lines 13, signal lines 12 and ground lines 11 by means of first, second and third thin metal wires 4a, 4b and 4c, respectively. Similarly to the first embodiment, the thin metal wires 4a to 4c are designed to be disposed substantially in parallel with one another and have substantially the same length. In addition, the thin metal wires 4a to 4c are disposed within a length L of 700 μm.

The same number of signal planes 17 as the number of the signal electrode pads (S) are formed on the top layer 2b of the multi-layered substrate 2a. Each of the signal lines 12 is electrically and directly connected to an associated external terminal (not illustrated) through the signal plane 17.

There are also formed power supply planes 16 on an intermediate layer 2c of the multi-layered substrate 2a. The power supply lines 13 are connected to the power supply planes 16 through through-holes 7 formed throughout the multi-layered substrate 2a. The power supply planes 16 converge the power supply lines 13, and thus the power supply lines 13 are electrically connected to external terminals (not illustrated), which are smaller in number than the power supply electrode pads (P), through the power supply planes 16.

There are further formed a plurality of ground planes 15 formed on a lower layer 2d of the multi-layered substrate 2a. The ground lines 11 are connected to the ground planes 15 through cavity plating 14 formed on a sidewall of the multi-layered substrate 2a, and converged to the smaller number ones. Then, the ground lines 11 are electrically connected to external terminals (not illustrated), which are smaller in number than the ground electrode pads (G), through the ground planes 15.

The above mentioned second embodiment provides the same advantages as those of the first embodiment.

In accordance with the wire-bonding type semiconductor device of the present invention, it is possible to remarkably reduce the effective inductance of the thin metal wires, and thus it is also possible to provide a high-speed operable semiconductor device which can be fabricated by conventional wire-bonding techniques and has significantly low ground bounce noise and cross-talk which would be caused by concurrent switching.

In addition, the invention makes it unnecessary to increase the number of internal terminals through which the electrode pads are to be electrically connected to external terminals. Thus, the wire-bonding type semiconductor device made in accordance with the present invention can be connected to existing external terminals without any modification thereof.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A wire-bonding type semiconductor device comprising:
   a semiconductor chip;
   a plurality of power supply electrode pads formed on said semiconductor chip;
   a plurality of signal electrode pads formed on said semiconductor chip;
   a plurality of ground electrode pads formed on said semiconductor chip;
   a plurality of first thin metal wires for electrically connecting said power supply electrode pads to associated internal terminals of a package;
   a plurality of second thin metal wires for electrically connecting said signal electrode pads to associated internal terminals of a package; and
   a plurality of third thin metal wires for electrically connecting said ground electrode pads to associated internal terminals of a package;
   said power supply electrode pads, said signal electrode pads and said ground electrode pads being arranged in sets on said semiconductor chip so that each set includes at least one signal electrode pad being always disposed intermediate between a power supply electrode pad and a ground electrode pad, and the distance between said sets is larger than the distance between the power supply electrode pads, signal electrode pads, and ground electrode pads in each set, and said first, second and third thin metal wires are designed so that a first thin metal wire, a third thin metal wire and at least one second thin metal wire located intermediate between said first and third thin metal wires are disposed substantially in parallel with one another and have substantially the same length.

2. The wire-bonding type semiconductor device as set forth in claim 1, wherein wires leading from said power supply electrode pads and said ground electrode pads to said associated internal terminals of a package, route to external terminals which are provided so that the number of power supply external terminals and ground external terminals is smaller than the number of said power supply electrode pads and ground electrode pads.

3. The wire-bonding type semiconductor device as set forth in claim 1, wherein said first thin metal wire, said third thin metal wire and said at least one second thin metal wire located intermediate between said first and third thin metal wires are disposed within a width of 700 μm.

4. The wire-bonding type semiconductor device as set forth in claim 2, wherein said first thin metal wire, said third thin metal wire and said at least one second thin metal wire located intermediate between said first and third thin metal wires are disposed within a width of 700 μm.

5. The wire-bonding type semiconductor device as set forth in claim 2, wherein said wire-bonding type semiconductor device has a plastic ball grid array structure.

6. The wire-bonding type semiconductor device as set forth in claim 2, wherein said semiconductor chip is mounted on a package constituted of a multi-layered substrate.

7. The wire-bonding type semiconductor device as set forth in claim 5, wherein said at least one second thin metal wire located intermediate between said first and third thin metal wires is a wire for emitting a signal therefrom.

8. The wire-bonding type semiconductor device as set forth in claim 6, wherein said at least one second thin metal wire located intermediate between said first and third thin metal wires is a wire for emitting a signal therefrom.

9. A wire-bonding type semiconductor device comprising:
a semiconductor chip;
a plurality sets of electrode pads formed on said semiconductor chip, each set including a power supply electrode, at least one signal electrode pad and a ground electrode pad arranged in this order;
a mount on which said semiconductor chip is placed, said mount being formed with the same number of extensions as the number of said ground electrode pads, said extensions acting as ground leads;
the same number of power supply leads as the number of said ground electrode pads;
the same number of signal leads as the number of said ground electrode pads;
said power supply leads, said signal leads and said extensions acting as ground leads being arranged in this order; and
metal wires for connecting each of said power supply electrode pads, signal electrode pads and ground electrode pads to said power supply leads, said signal leads and said extensions, respectively, said metal wires being disposed substantially in parallel with one another and having substantially the same length.

10. The wire-bonding type semiconductor device as set forth in claim 9, wherein said extensions are short-circuited with one another in said mount so that ground external terminals are smaller in number than said ground electrode pads.

11. The wire-bonding type semiconductor device as set forth in claim 9, wherein said power supply leads are electrically connected to one another by power supply planes through through-holes formed throughout said package, to external terminals disposed on a lower surface of said package.

12. The wire-bonding type semiconductor device as set forth in claim 9, wherein said metal wires are disposed within a width of 700 μm.

13. A wire-bonding type semiconductor device comprising:
a multi-layered substrate;
a semiconductor chip mounted on said multi-layered substrate;
a plurality of power supply electrode pads formed on said semiconductor chip;
a plurality of signal electrode pads formed on said semiconductor chip;
a plurality of ground electrode pads formed on said semiconductor chip;
said power supply electrode pads, said signal electrode pads and said ground electrode pads being arranged on said semiconductor chip so that at least one signal electrode pad is always disposed intermediate between a power supply electrode pad and a ground electrode pad,
a plurality of power supply leads formed on a first layer of said multi-layered substrate;
a plurality of signal leads formed on a first layer of said multi-layered substrate;
a plurality of ground leads formed on a first layer of said multi-layered substrate;
a plurality of first thin metal wires for electrically connecting said power supply electrode pads to said power supply leads;
a plurality of second thin metal wires for electrically connecting said signal electrode pads to said signal leads;
a plurality of third thin metal wires for electrically connecting said ground electrode pads to said ground leads;
said first, second and third thin metal wires are designed so that a first thin metal wire, a third thin metal wire and at least one second thin metal wire located intermediate between said first and third thin metal wires are disposed substantially in parallel with one another and have substantially the same length.
the same number of signal planes as the number of said signal electrode pads, said signal planes being formed on said first layer of said multi-layered substrate, said signal leads being connected to external terminals through said signal planes;
a plurality of power supply planes formed on a second layer of said multi-layered substrate, said power supply leads being connected to said power supply planes through through-holes formed throughout said multi-layered substrate, and converged with one another so that said power supply leads are connected to external terminals which are smaller in number than said power supply electrode pads; and a plurality of ground planes formed on a third layer of said multi-layered substrate, said ground leads being connected to said ground planes through metal plating formed on a sidewall of said multi-layered substrate, and converged with one another so that said ground leads are connected to external terminals which are smaller in number than said ground electrode pads.

14. The wire-bonding type semiconductor device as set forth in claim 13, wherein said first layer of said multi-layered substrate is disposed on or above said second layer, and said second layer is disposed on or above said third layer.

15. The wire-bonding type semiconductor device as set forth in claim 13, wherein said first thin metal wire, said third thin metal wire and said at least one second thin metal wire located intermediate between said first and third thin metal wires are disposed within a width of 700 µm.

* * * * *